US006731760B2

(12) United States Patent
Pedersen

(10) Patent No.: US 6,731,760 B2
(45) Date of Patent: May 4, 2004

(54) ADJUSTING A LOUDSPEAKER TO ITS ACOUSTIC ENVIRONMENT: THE ABC SYSTEM

(75) Inventor: Jan A. Pedersen, Holstebro (DK)

(73) Assignee: Bang & Olufsen A/S, Struer (DK)

( * ) Notice: Subject to any disclaimer, the term of this patent is extended or adjusted under 35 U.S.C. 154(b) by 263 days.

(21) Appl. No.: 10/062,086

(22) Filed: Jan. 29, 2002

(65) Prior Publication Data

US 2002/0154785 A1 Oct. 24, 2002

Related U.S. Application Data

(63) Continuation of application No. 08/743,593, filed on Nov. 4, 1996, now abandoned.

(30) Foreign Application Priority Data

Nov. 2, 1995 (DK) ............................................. 1224/95

(51) Int. Cl.[7] ........................... H04R 29/00; H03G 5/00
(52) U.S. Cl. .............................. 381/59; 381/98; 381/96
(58) Field of Search ............................. 381/59, 96, 58, 381/98, 103, 61, 63

(56) References Cited

U.S. PATENT DOCUMENTS 4,109,107 A 8/1978 Boast ........................ 179/1 D
4,823,391 A * 4/1989 Schwartz .................... 381/103
5,303,307 A 4/1994 Elko et al. ..................... 381/92
5,327,504 A 7/1994 Hobelsberger ............... 381/96
5,377,274 A 12/1994 Meyer et al. ................. 381/59
5,511,129 A * 4/1996 Craven et al. .............. 381/103
5,694,476 A 12/1997 Klippel ........................ 381/96
6,370,253 B1 * 4/2002 Onishi et al. ................. 381/98

* cited by examiner

*Primary Examiner*—Xu Mei
*Assistant Examiner*—Brian T. Pendleton

(57) ABSTRACT

A method and corresponding apparatus for controlling the performance of a loudspeaker in a room includes the steps of, in a first acoustic environment, which may be regarded as a reference, determining the acceleration, velocity or displacement of the loudspeaker diaphragm and the sound pressure in front of the diaphragm, and, based on these quantities, determining the radiation resistance, radiated acoustic power or real part of the acoustic wave impedance. Thereafter, the above step is repeated in a second acoustic environment, which will normally be the actual listening room in which the loudspeaker is to be used. Based on the above measurements, the ratio between the radiation resistances, radiated power or real part of the acoustic wave impedances is determined, and the ratio, optionally after suitable further processing, is used to control a controllable correction filter inserted in the signal path of the loudspeaker, whereby the performance of the loudspeaker in the second acoustic environment can be brought substantially to match the performance of the loudspeaker in the first acoustic environment.

44 Claims, 1 Drawing Sheet

ADJUSTING A LOUDSPEAKER TO ITS ACOUSTIC ENVIRONMENT: THE ABC SYSTEM

CROSS-REFERENCE TO RELATED APPLICATIONS

This is a continuation application of U.S. patent application Ser. No. 08/742,593, filed Nov. 4, 1996 now abandoned.

BACKGROUND OF THE INVENTION

1. Field of the Invention

The invention relates to a method and apparatus for controlling the performance of a loudspeaker in a room.

2. Description of the Related Art

The actual performance of a loudspeaker is known to be highly dependent on the acoustics of the actual listening room and the actual loudspeaker position within this room. In particular, the performance of a loudspeaker will change very noticeably when it is in proximity to the boundaries of the room. This is caused by the loading of the room on the loudspeaker as a radiator, or, in other words, due to the changing radiation resistance. A change of listener position changes the perceived performance of the loudspeaker, in particular, due to early reflections and standing waves. However, some boundary effects are universal in the room, in particular, in the bass frequency range, and hence, the perception of this range is less influenced by the listener position.

Loudspeaker designers experience this fact by having to make a compromise when optimizing the timbre of the loudspeaker so that the perceived sound will be acceptable under a number of different conditions, i.e., different room acoustics, loudspeaker positions, and listening positions. Even though making this compromise, the designer cannot ensure that the customer will always experience the intended quality. Thus, the listener will experience a performance of the loudspeaker that depends on the acoustic properties of the actual listening room and the position chosen for both loudspeaker and listener. There is a risk that an expensive loudspeaker which performs very well in the shop, will turn out performing badly, or at least disappointingly, when placed in a different environment and/or different position.

In order to compensate for this problem, it is known to fit a switch in the cross-over filter unit in the loudspeaker in order that the bass response may be modified to suit a particular placement of the loudspeaker. At best, this must be considered a poor compromise, and if at all possible, the precise adjustment will be dependent on a measurement of the room characteristics. Some automatic systems are based on measuring the transfer function of the loudspeaker using an omni-directional microphone, placed at the preferred listening position, or a number of representative positions. An equalizing filter is then inserted so that the resulting transfer function approximates a target function, which, e.g., can be flat in the frequency range of interest.

Systems of the above kind are, for instance, disclosed in U.S. Pat. No. 4,109,107 to Boast and in U.S. Pat. No. 5,511,129 to Craven et al.

In particular, U.S. Pat. No. 4,109,107 discloses a method and apparatus for frequency compensation of an electro-acoustical transducer and its environment, in which it is possible to compensate for the acoustics of a specific listening room relative to the acoustics of an anechoic environment, the anechoic environment being regarded as defining ideal performance characteristics of the transducer, specifically, a loudspeaker system. The compensation for room acoustics is based on measurements of sound pressure at a number of different listening positions in the actual listening room and comparison of the result of these measurements with similar measurements performed in an anechoic room. Specifically, microphone locations were chosen at three positions in an actual listening room and the sound pressures were measured by means of a microphone with a cardioid directional characteristic. Three different orientations of the microphone were used in each of said positions thus yielding a total of nine measurements. These measurements were then averaged and compared with similar measurements performed in an anechoic room thereby yielding an acoustic gain factor for the specific room. It is thereafter possible to compensate for this unwanted effect of the actual listening room.

U.S. Pat. No. 5,511,129 discloses compensating filters for use in obtaining a given, desired amplitude and phase response of a loudspeaker used in an actual listening room. According to this patent, the response of the loudspeaker is initially measured by placing the loudspeaker in an anechoic room, passing a test signal through the loudspeaker and picking up the reproduced audio signal via a microphone. The loudspeaker is then placed in the actual listening room and the microphone is placed at a listener position in the room. The electrical test signal is supplied to the loudspeaker and the resulting audio signal received by the microphone is measured and stored. The microphone is then moved to another point and the process is repeated. Once sufficient measurements have been taken, a coefficient calculator determines a room response from a combination of the stored measurements, jointly representative of all the points at which the measurements were taken. This response includes the response due to the loudspeaker itself. The coefficient calculator therefore uses a stored model of the loudspeaker response jointly with the combined measured response to derive the response of the listening room (averaged over the positions in which the measurements were actually made), thereby eliminating the dependence upon the loudspeaker. A compensation response to substantially compensate for the derived room response is then derived, and combined with the loudspeaker compensation response. From the combined compensation responses, the coefficients of a digital correction filter are then derived, and the thus determined correction filter can then be used during subsequent audio reproduction in the actual listening room.

A major problem of such systems is the sensitivity to changes in the position of the sound source as well as the receiver. If the position of the loudspeaker or the listener is changed after calculating the equalizing filter, the effects can be severe coloration, pre-echoes, etc. Another problem of such systems is the choice of a suitable target function, where a flat function may not be found to be optimal.

A substantially different approach to the compensation for unwanted influences of the acoustics of the actual listening room is disclosed in International Patent Application No. WO 84/00274 to Adams, which discloses an environmental-adaptive loudspeaker system. This document discloses the use of pressure sensing means and acceleration sensing means for determining the instantaneous sound pressure at the surface of a loudspeaker diaphragm and the acceleration of this diaphragm, and based this sound pressure and acceleration, determines control signals for controlling the transfer function of a controllable correction filter via which filter input signals are fed to the loudspeaker. The compensation for unwanted influences of the acoustics of a listening room can thus be based on measurements carried out in the near field of the loudspeaker instead of (a number of) measurements carried out at actual listening positions in the room. Specifically, the control signal for the correction filter is the cosine of the argument of the radiation impedance as seen from the loudspeaker diaphragm,

SUMMARY OF THE INVENTION

It has, in the present invention, been realized that since all the involved acoustic phenomena's are considered to be linear, what is actually compensated through the apparently sensible procedures discussed above is the superposition of several phenomena, such as standing waves/natural frequencies of the room, early reflections, reverberation and the reduction of angular space angle due to the boundary effect, and it is considered that this is the reason why the known procedures will only function for one listening position.

It is the purpose of the invention to provide a method and apparatus for controlling the performance of a loudspeaker in a room in order that it becomes independent of the placement of the loudspeaker. This is obtained in a method according to the invention which is particular in that, in a first acoustic environment, the movement, e.g., velocity, of the diaphragm of the loudspeaker driver and the force, arising from the sound field, acting on it are determined by measuring suitable parameters, that, in a second acoustic environment, the same parameters of the loudspeaker driver, relating to the room, are measured, that the ratio between the measurements is used to adjust the performance of a correcting filter, and that the filter is applied in the signal chain to the loudspeaker driver.

The invention, known as the Adaptive Bass Control (ABC) System, is based on the realization that there is a strong link between the way the loudspeaker sounds, in particular, in the bass range, and its radiation resistance as a function of frequency, being the real part of the radiation impedance. Implementing the invention for a loudspeaker has proven to significantly increase the certainty that the customer will always experience the quality intended by the loudspeaker designer. This is achieved by measuring the radiated power output, radiation resistance or any similar physical parameter, e.g., the real part of the acoustic wave is impedance, near the diaphragm, when the loudspeaker is placed in the actual position, and comparing this to a reference measurement. More precisely, this is obtained in that the loudspeaker, in a first step, is put in a reference room environment where it performs to a standard to be determined, and during which a reference radiated power output (real, i.e., active) or reference radiation resistance of a driver as a function of frequency is measured, and in that, in a second step, the loudspeaker is put in its room of usage where its attendant radiated power output or radiation resistance is measure, the ratio between the real (active) power outputs or radiation resistances, respectively, being used to adjust the transfer function of a correcting filter in order to obtain said standard of performance determined in said reference room environment, and that, in a third step, said correcting filter is introduced in the electrical signal path to the driver. In principle, a multi-driver loudspeaker should have each driver subjected to such a measurement, however, one or several may be selected as representative. At the time of measurement of one particular driver or a group of drivers, the other drivers may either be short-circuited, disconnected or connected to the signal.

When the loudspeaker is placed in a position which is not identical to the reference position/room, the bass performance changes. However, the method according to the invention is able to detect a major part of this change in the acoustic environment of the loudspeaker and to correct accordingly. Switching on and off an apparatus working according to the principles of the invention can lead to dramatic changes of the bass performance of the loudspeaker depending on how different the actual position and room are from the reference conditions. If a loudspeaker is designed to operate away from the walls of a room, then when placing such a loudspeaker close to a corner of the listening room, the bass performance becomes boomy, colored, and the sound pressure level increases. In such a situation, the apparatus according to the principles of the invention corrects the timbre in such a way that the perceived timbre is almost the same as in the reference position. The effect of the apparatus in this situation has been described by listeners as quite startling. The bass performance then was not plagued by the rumble which is traditionally a characteristic of a corner position, and the bass performance becomes more even and neutral without becoming tithing. In a corner position, this is perceived as a dramatic improvement of the bass performance.

An advantageous embodiment is particular in that the loudspeaker is permanently fitted with measurement means, the ratio between reference and use measurements being used to adjust the parameters of the correcting filter. This enables a measurement to be initiated by a user or in the event that some predefined conditions are met, e.g., power up of the apparatus. This measurement cycle could be performed using a dedicated measuring signal, e.g., obtained from a particular Compact Disc.

A further advantageous embodiment of the invention is particular in that the loudspeaker is permanently fitted with measurement means, and the radiated power output or radiation resistance, which corresponds to the reference parameter, is continuously measured during operation of the apparatus. The ratio between reference and usage measurements being used to adjust the parameters of the correcting filter. This means that the loudspeaker will be automatically and continuously adaptable to any new listening room environment, e.g., using the played music as the stimuli when measuring the parameter. In this case, the parameter in the usage situation is continuously measured, and, e.g., a digital signal processor in the signal chain calculates and performs the filtering which provides a sound from the loudspeaker which is very similar to the sound in the reference position/room and which presumably was judged positively during the design of the loudspeaker.

A further advantageous embodiment is particular in that the listening room is divided into zones of, e.g., 30 cm by 30 cm, each having a correction filter transfer function assigned to it, and that information on the particular zone is fed to the correcting filter in the electrical signal path to the loudspeaker. By this means, it is possible to accommodate a number of typical placements of a loudspeaker and to obtain a large degree of the improvement according to the invention, without having to perform a measurement.

A simpler arrangement is obtained by instructing the user to activate switches according to a schematic showing various typical placements of a loudspeaker in a room. This functions in practice, provided the loudspeaker is of the same type as the loudspeaker used in the reference environment.

An apparatus according to the invention is particular in that it comprises a filter, the transfer function of which is controllable by electronic/numerical signals, said signals being obtained from a unit which determines the ratio between a stored reference radiation resistance or active power output (real) as a function of frequency and a measured radiation resistance or active power output (real) in the usage situation. This ratio basically adjusts the amplitude response of the correction filter, and various filter implementations, e.g., minimum phase can be obtained from this. However, various operations might be performed to modify the ratio before implementation, e.g., smoothing, convolution, frequency limiting, correction limiting, logarithm, exponential, multiplication, addition, etc., and combinations of these. For instance, adjusting the amplitude response of the correction filter as the square root of the ratio seems to be a reasonable choice.

BRIEF DESCRIPTION OF THE DRAWINGS

The invention will be further described in the following with reference to the drawing, in which.

DESCRIPTION OF THE PREFERRED EMBODIMENTS

Figure 1:
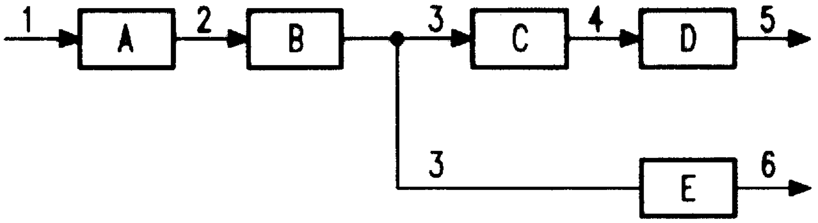
FIG. 1 shows the electrical, mechanical and acoustical signal paths associated with a loudspeaker placed in a room.

By way of example, FIG. 1 shows the signal path and transfer functions relating to a loudspeaker in a room. The electrical signal from the source is fed to a power amplifier A which drives the loudspeaker which is designated B and comprises the electrical and mechanical parts of the loudspeaker driver unit and the acoustic influence of the cabinet enclosure. The output form the loudspeaker is transformed by the transfer function C from the acceleration of the diaphragm to the sound pressure in front of the diaphragm which may be measured by a microphone D as one example of how to obtain the force, arising from the sound field, acting on the diaphragm. An accelerometer E, for example, may measure the diaphragm acceleration directly. At point 1, the source signal is provided, at point 2, the electrical input signal to the loudspeaker driver is available, point 3 refers to the acceleration of the diaphragm of the loudspeaker, and at point 4, the sound pressure at some predetermined and fixed point in front of the driver is available. After being converted by the microphone D, an electrical signal representing the sound pressure is available at point 5, and, correspondingly, an electrical representing the diaphragm acceleration is available at point 6.

Figure 2:
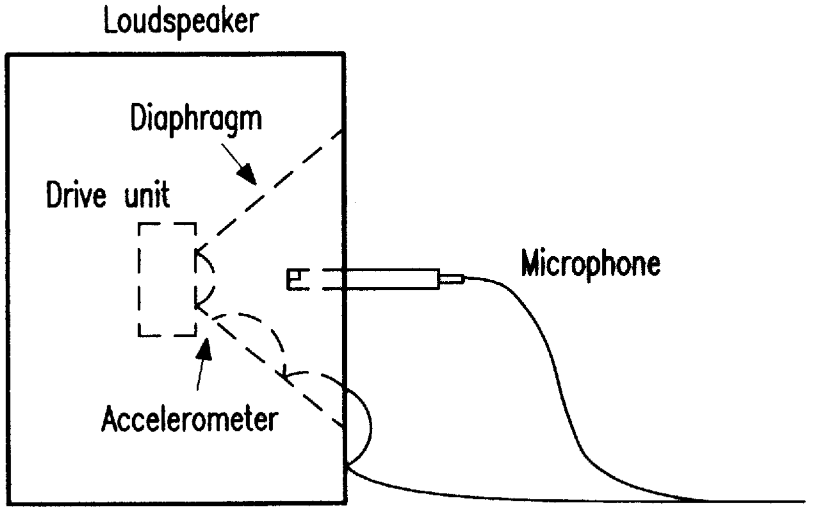
FIG. 2 shows a loudspeaker with a driver and measuring transducers.

FIG. 2 shows one embodiment of the invention where the loudspeaker B with one of a multitude of possible placements of a microphone D and an accelerometer E As shown in FIG. 2, the microphone D is positioned in close proximity of the diaphragm of the loudspeaker, preferably, within the envelope defined by the boundaries of the loudspeaker enclosure.

Figure 3:
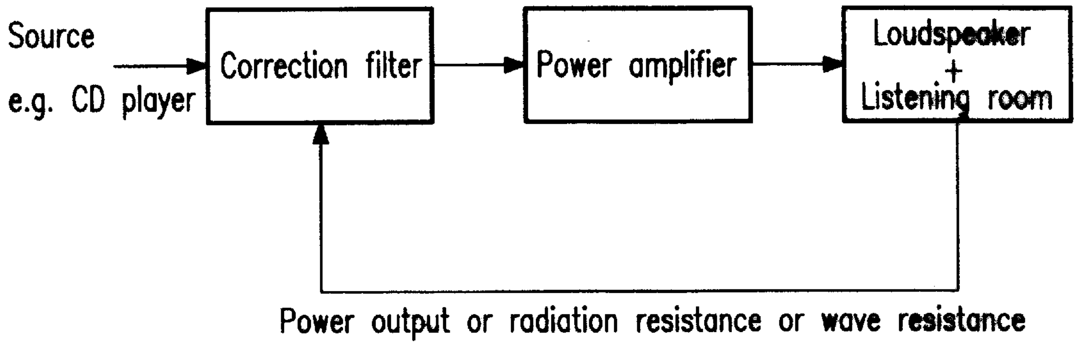
FIG. 3 shows a schematic of how the correction filter can be inserted in the signal chain according to one embodiment of the invention.

FIG. 3 shows how a measurement of the radiation resistance of the loudspeaker is used when calculating the filter F, which is switched into the signal path. The signal processing may occur through any means available to the skilled person, the result will be a linear pre-distortion of the signal to the power amplifier in order that the loudspeaker provides an excitation of the listening room so that the perceived sound is a good approximation to the quality determined during the design phase. The advantage of making the measurement continuous is that the system will automatically compensate, e.g., for and influx of listeners or a changed placement of furniture or the loudspeaker placement itself, which disturbs the sound distribution in the room. Such a disturbance is now compensated so that the perceived sound is essentially unchanged.

What is claimed is:

1. A method for controlling a loudspeaker system in a room, said method comprising the steps of:

(a) determining, in a first acoustic environment, a first resultant acceleration, velocity or displacement of a driver diaphragm of the loudspeaker system, and a first sound pressure in front of and in close proximity of said diaphragm;

(b) determining, based on said first sound pressure, a first associated force, arising from a first sound field in the first acoustic environment, acting on the driver diaphragm;

(c) determining, based on said first acceleration, velocity or displacement and said first associated force, either a first acoustic radiation resistance of a first radiation impedance experienced by said driver diaphragm, a first radiated acoustic power from said driver diaphragm, or a first real part of a first acoustic wave impedance near the driver diaphragm in the first acoustic environment;

(d) determining, in a second acoustic environment, a second resultant acceleration, velocity or displacement of the driver diaphragm of the loudspeaker system and a second sound pressure in front of and in close proximity of said diaphragm;

(e) determining, based on said determined second sound pressure, a second associated force, arising from a second sound field in the second acoustic environment, acting on the driver diaphragm;

(f) determining, based on said second acceleration, velocity or displacement and said second associated force, either a second acoustic radiation resistance of a second radiation impedance experienced by said driver diaphragm, a second radiated acoustic power from said driver diaphragm, or a second real part of a second acoustic wave impedance near the driver diaphragm in the second acoustic environment;

(g) determining a ratio between either said first and second radiation resistances in the first and second acoustic environments, or between said first and second radiated acoustic powers in the first and second acoustic environments, or between said first and second real parts of the first and second acoustic wave impedances, respectively, near the driver diaphragm in the first and second acoustic environments;

(h) inserting a controllable correction filter in a signal path to said driver; and (i) adjusting parameters of the controllable correction filter using said ratio, whereby the performance of said loudspeaker system in said second acoustic environment substantially matches the performance of said loudspeaker system in said first acoustic environment.

2. The method as claimed in claim 1, wherein said first and second acoustic environments are rooms, one of which is an actual listening room in which the loudspeaker system is to be used.

3. The method as claimed in claim 1 or 2, furthermore comprising the steps of:

(j) subdividing said second acoustic environment into a number of zones;

(k) positioning the loudspeaker system in each of said zones and performing the steps (d), (e), (f) and (g) for each of said zones, and storing the ratio for each zone;

(l) placing the loudspeaker system in a desired one of said zones for sound reproduction; and (m) selecting the stored ratio corresponding to said zone and adjusting the parameters of said controllable filter using this ratio.

4. The method as claimed in claim 1 or 2, wherein said ratio is modified prior to being used for adjusting the parameters of said controllable correction filter.

5. The method according to claim 4, wherein said modification of the ratio includes forming the square root of the ratio and adjusting the parameters of the correction filter such that the amplitude response of the correction filter corresponds to said square root of the ratio.

6. The method as claimed in claim 3, wherein said ratio is modified prior to being used for adjusting the parameters of said controllable correction filter.

7. The method as claimed in claim 6, wherein said modification of the ratio includes forming the square root of the ratio and adjusting the parameters of the correction filter such that the amplitude response of the correction filter corresponds to said square root of the ratio.

8. The method as claimed in claim 1 or 2, wherein said loudspeaker system comprises multiple drivers and corresponding driver diaphragms, said drivers being divided into one or more group(s) of drivers, each of said group(s) including one, a plurality of or all of the drives, wherein said ratio is determined separately for each of said drivers, and wherein each of said drivers is corrected separately using a corresponding one of said ratios.

9. The method as claimed in claim 8, wherein the drivers not belonging to said groups of drivers that are not corrected are either disconnected, connected or short-circuited during the determination of said ratio.

10. The method as claimed in claim 8, wherein one or more driver(s) belonging to each of said groups is/are chosen as representative for that group and where said ratio is determined based on that particular loudspeaker and used for correcting of all members of that group.

11. The method as claimed in claim 8, wherein those drivers of a group that are not chosen as representative for the group are either disconnected, connected or short-circuited during the determination of said ratio.

12. The method as claimed in claim 3, wherein said loudspeaker system comprises multiple drivers and corresponding driver diaphragms, said drivers being divided into one or more group(s) of drivers, each of said group(s) including one, a plurality of or all of the drives, wherein said ratio is determined separately for each of said drivers, and wherein each of said drivers is corrected separately using a corresponding one of said ratios.

13. The method as claimed in claim 12, wherein the drivers not belonging to said groups of drivers that are not corrected are either disconnected, connected or short-circuited during the determination of said ratio.

14. The method as claimed in claim 12, wherein one or more driver(s) belonging to each of said groups is/are chosen as representative for that group and where said ratio is determined based on that particular loudspeaker and used for correcting of all members of that group.

15. The method as claimed in claim 12, wherein those drivers of a group that are not chosen as representative for the group are either disconnected, connected or short-circuited during the determination of said ratio.

16. The method as claimed in claim 4, wherein said loudspeaker system comprises multiple drivers and corresponding driver diaphragms, said drivers being divided into one or more group(s) of drivers, each of said group(s) including one, a plurality of or all of the drives, wherein said ratio is determined separately for each of said drivers, and wherein each of said drivers is corrected separately using a corresponding one of said ratios.

17. The method as claimed in claim 16, wherein the drivers not belonging to said groups of drivers that are not corrected are either disconnected, connected or short-circuited during the determination of said ratio.

18. The method as claimed in claim 16, wherein one or more driver(s) belonging to each of said groups is/are chosen as representative for that group and where said ratio is determined based on that particular loudspeaker and used for correcting of all members of that group.

19. The method as claimed in claim 16, wherein those drivers of a group that are not chosen as representative for the group are either disconnected, connected or short-circuited during the determination of said ratio.

20. The method as claimed in claim 5, wherein said loudspeaker system comprises multiple drivers and corresponding driver diaphragms, said drivers being divided into one or more group(s) of drivers, each of said group(s) including one, a plurality of or all of the drives, wherein said ratio is determined separately for each of said drivers, and wherein each of said drivers is corrected separately using a corresponding one of said ratios.

21. The method as claimed in claim 20, wherein the drivers not belonging to said groups of drivers that are not corrected are either disconnected, connected or short-circuited during the determination of said ratio.

22. The method as claimed in claim 20, wherein one or more driver(s) belonging to each of said groups is/are chosen as representative for that group and where said ratio is determined, based on that particular loudspeaker and used for correcting of all members of that group.

23. The method as claimed in claim 20, wherein those drivers of a group that are not chosen as representative for the group are either disconnected, connected or short-circuited during the determination of said ratio.

24. An apparatus for controlling a loudspeaker system comprising:

a controllable correction filter controllable by electronic/numerical signals;

means for measuring an acceleration, velocity or displacement of a driver diaphragm of said loudspeaker system in a first environment and a second environment;

means for measuring a sound pressure in front of and in close proximity of said driver diaphragm in said first and second environments;

means for determining a first and a second radiation resistance of a radiation impedance based on said measured acceleration, velocity or displacement of the diaphragm and said measured sound pressure in said first and second environments;

means for storing said first and second radiation resistances;

means for forming a ratio between said first and second radiation resistances; and means for providing said ratio as said electronic/numerical signals to said controllable correction filter, whereby a frequency response of the correction filter is determined by said ratio.

25. The apparatus as claimed in claim 24, wherein said means for forming the ratio furthermore modifies said ratio prior to providing the ratio as said electronic/numerical signals to said controllable correction filter.

26. The apparatus according to claim 25, wherein said modification comprises one or more operations from the group: smoothing, convolution, frequency limiting, correction limiting, forming the logarithm, forming the exponential, multiplication, addition and forming the square root.

27. The apparatus as claimed in claim 24, 25 or 26, wherein said apparatus further comprises means for generating a test signal to be radiated by the loudspeaker system during performance of said measurements.

28. The apparatus as claimed in claim 27, wherein said means for generating a test signal is a compact disc drive.

29. The apparatus as claimed claim 27, wherein an audio signal to be reproduced by the loudspeaker system is used as said test signal.

30. The apparatus as claimed in claim 24, 25 or 26, wherein said loudspeaker system comprises multiple drivers and corresponding driver diaphragms, and wherein said apparatus determines separate ratios for each of said drivers.

31. An apparatus for controlling a loudspeaker system comprising:

a controllable correction filter controllable by electronic/numerical signals;

means for measuring an acceleration, velocity or displacement of the driver diaphragm of said loudspeaker system in a first environment and a second environment;

means for measuring a sound pressure in front of and in close proximity of said driver diaphragm in said first and second environments;

means for determining a first and a second radiated acoustic power based on said measured acceleration, velocity or displacement of the driver diaphragm and said measured sound pressure in said first and second environments;

means for storing said first and second radiated acoustic powers;

means for forming a ratio between said first and second radiated acoustic powers; and means for providing said ratio as said electronic/numerical signals to said controllable correction filter, whereby a frequency response of the correction filter is determined by said ratio.

32. The apparatus as claimed in claim 31, wherein said means for forming the ratio furthermore modifies said ratio prior to providing the ratio as said electronic/numerical signals to said controllable correction filter.

33. The apparatus according to claim 32, wherein said modification comprises one or more operations from the group: smoothing, convolution, frequency limiting, correction limiting, forming the logarithm, forming the exponential, multiplication, addition and forming the square root.

34. The apparatus as claimed in claim 31, 32 or 33, wherein said apparatus further comprises means for generating a test signal to be radiated by the loudspeaker system during performance of said measurements.

35. The apparatus as claimed in claim 34, wherein said means for generating a test signal is a compact disc drive.

36. The apparatus as claimed claim 34, wherein an audio signal to be reproduced by the loudspeaker system is used as said test signal.

37. The apparatus as claimed in claim 31, 32 or 33, wherein said loudspeaker system comprises multiple drivers and corresponding driver diaphragms, and wherein said apparatus determines separate ratios for each of said drivers.

38. An apparatus for controlling a loudspeaker system comprising:

a controllable correction filter controllable by electronic/numerical signals;

means for measuring an acceleration, velocity or displacement of the driver diaphragm of said loudspeaker system in a first environment and a second environment;

means for measuring a sound pressure in front of and in close proximity of said driver diaphragm in said first and second environments;

means for determining a first and a second real part of an acoustic wave impedance based on said measured acceleration, velocity or displacement of the driver diaphragm and said measured sound pressure in said first and second environments;

means for storing said first and second real part of the acoustic wave impedances;

means for forming a ratio between said first and second real part of the acoustic wave impedances; and means for providing said ratio as said electronic/numerical signals to said controllable correction filter, whereby a frequency response of the correction filter is determined by said ratio.

39. The apparatus as claimed in claim 38, wherein said means for forming the ratio furthermore modifies said ratio prior to providing the ratio as said electronic/numerical signals to said controllable correction filter.

40. The apparatus according to claim 39, wherein said modification comprises one or more operations from the group: smoothing, convolution, frequency limiting, correction limiting, forming the logarithm, forming the exponential, multiplication, addition and forming the square root.

41. The apparatus as claimed in claim 38, 39 or 40, wherein said apparatus further comprises means for generating a test signal to be radiated by the loudspeaker system during performance of said measurements.

42. The apparatus as claimed in claim 41, wherein said means for generating a test signal is a compact disc drive.

43. The apparatus as claimed claim 41, wherein an audio signal to be reproduced by the loudspeaker system is used as said test signal.

44. The apparatus as claimed in claim 31, 32 or 33, wherein said loudspeaker system comprises multiple drivers and corresponding driver diaphragms, and wherein said apparatus determines separate ratios for each of said drivers.

* * * * *